(12) United States Patent
Choi et al.

(10) Patent No.: US 11,910,681 B2
(45) Date of Patent: *Feb. 20, 2024

(54) DISPLAY APPARATUS

(71) Applicant: Samsung Display Co., Ltd., Yongin-si (KR)

(72) Inventors: Yoonsun Choi, Hwaseong-si (KR); Seong Ryong Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/974,907

(22) Filed: Oct. 27, 2022

(65) Prior Publication Data

US 2023/0053163 A1 Feb. 16, 2023

Related U.S. Application Data

(63) Continuation of application No. 16/549,515, filed on Aug. 23, 2019, now Pat. No. 11,552,160.

(30) Foreign Application Priority Data

Sep. 10, 2018 (KR) .................. 10-2018-0107765

(51) Int. Cl.
*H10K 59/13* (2023.01)
*H10K 59/131* (2023.01)
(Continued)

(52) U.S. Cl.
CPC ....... *H10K 59/1315* (2023.02); *H10K 50/844* (2023.02); *H10K 59/122* (2023.02);
(Continued)

(58) Field of Classification Search
CPC ............. H10K 59/1315; H10K 50/844; H10K 59/1213; H10K 59/122; H10K 59/124;
(Continued)

(56) References Cited

U.S. PATENT DOCUMENTS

2004/0183083 A1* 9/2004 Koo .................... H10K 59/1315
257/93
2005/0017929 A1* 1/2005 Sano .................... G09G 3/3233
345/76
(Continued)

FOREIGN PATENT DOCUMENTS

KR 100611153 B1 8/2006
KR 1020110123983 A 11/2011
(Continued)

*Primary Examiner* — S M Sohel Imtiaz
(74) *Attorney, Agent, or Firm* — CANTOR COLBURN LLP

(57) ABSTRACT

A display apparatus includes a substrate, a first-layer power supply line disposed on a substrate in a peripheral area which surrounds a display area in which an image is displayed, a first insulation layer on the substrate on which the first-layer power supply line is disposed, a second-layer power supply line disposed on the first insulation layer and the first-layer power supply line, and contacting the first-layer power supply line, a second insulation layer on the first insulation layer on which the second-layer power supply line is disposed, and a light emitting structure disposed on the second insulation layer and including a first electrode, a light emitting layer and a second electrode which is electrically connected to the second-layer power supply line.

12 Claims, 14 Drawing Sheets

(51) Int. Cl.
*H10K 50/844* (2023.01)
*H10K 59/122* (2023.01)
*H10K 59/124* (2023.01)
*H10K 59/121* (2023.01)
*G09G 3/3233* (2016.01)

(52) U.S. Cl.
CPC ....... *H10K 59/124* (2023.02); *H10K 59/1213* (2023.02); *G09G 3/3233* (2013.01); *G09G 2300/0809* (2013.01)

(58) Field of Classification Search
CPC ...... H10K 59/88; H10K 59/12; H10K 59/131; H10K 59/179; G09G 3/3233; H01L 27/1214
See application file for complete search history.

(56) References Cited

U.S. PATENT DOCUMENTS

| | | | | |
|---|---|---|---|---|
| 2005/0117105 A1* | 6/2005 | Kang | ................. | H10K 59/1315 257/E27.111 |
| 2005/0269942 A1* | 12/2005 | Ahn | ....................... | H10K 50/86 313/503 |
| 2008/0100202 A1* | 5/2008 | Cok | ..................... | C23C 16/306 313/503 |
| 2011/0109611 A1* | 5/2011 | Nakamura | ............... | G09G 3/20 313/504 |
| 2011/0273109 A1 | 11/2011 | Park | | |
| 2011/0297942 A1 | 12/2011 | Kim et al. | | |
| 2015/0255017 A1* | 9/2015 | Kim | ..................... | G09G 3/3258 445/24 |
| 2016/0035809 A1* | 2/2016 | Park | .................... | H10K 59/1216 257/40 |
| 2016/0172506 A1* | 6/2016 | Kim | .................... | H01L 27/1255 257/43 |
| 2016/0181333 A1* | 6/2016 | Park | ...................... | H10K 50/865 438/23 |
| 2017/0076667 A1* | 3/2017 | Numata | ............... | G09G 3/3266 |
| 2017/0098795 A1 | 4/2017 | Kim | | |
| 2017/0110521 A1* | 4/2017 | Park | ...................... | H10K 50/84 |
| 2017/0141352 A1* | 5/2017 | Shin | .................. | G02F 1/133345 |
| 2017/0237025 A1* | 8/2017 | Choi | ...................... | H10K 50/80 257/40 |
| 2017/0237038 A1* | 8/2017 | Kim | ..................... | H10K 50/844 257/40 |
| 2018/0097034 A1 | 4/2018 | Lee et al. | | |
| 2021/0367027 A1* | 11/2021 | Okabe | ................ | H10K 59/1315 |

FOREIGN PATENT DOCUMENTS

| | | |
|---|---|---|
| KR | 1020110132819 A | 12/2011 |
| KR | 1020150094950 A | 8/2015 |
| KR | 1020180036907 A | 4/2018 |

\* cited by examiner

DISPLAY APPARATUS

This application is a continuation of U.S. patent application Ser. No. 16/549,515, filed on Aug. 23, 2019, which claims priority to Korean Patent Application No. 10-2018-0107765, filed on Sep. 10, 2018, and all the benefits accruing therefrom under 35 U.S.C. § 119, the content of which in its entirety is herein incorporated by reference.

BACKGROUND

1. Field

Exemplary embodiments of the invention relate to a display apparatus. More particularly, exemplary embodiments of the invention relate to a display apparatus including a power supply line in a peripheral area.

2. Description of the Related Art

Recently, a display apparatus having light weight and small size has been manufactured. A cathode ray tube ("CRT") display apparatus has been used due to a high performance and a competitive price. However, the CRT display apparatus has a weakness including size or portability. Therefore, a display apparatus such as a plasma display apparatus, a liquid crystal display apparatus and an organic light emitting display apparatus has been highlighted due to their small size, light weight and low-power-consumption.

Generally, the display apparatus includes a display area in which an image is displayed and a peripheral area which is non-display area and surrounds the display area. Efforts have been made to reduce the peripheral area and improve brightness of the display apparatus for the convenience of users.

SUMMARY

One or more exemplary embodiment of the invention provides a display apparatus capable of reducing a size of a peripheral area and improving brightness and display quality.

According to an exemplary embodiment of the invention, a display apparatus includes a substrate, a first-layer power supply line disposed on a substrate in a peripheral area which surrounds a display area in which an image is displayed, a first insulation layer on the substrate on which the first-layer power supply line is disposed, a second-layer power supply line disposed on the first insulation layer and the first-layer power supply line, and contacting the first-layer power supply line, a second insulation layer on the first insulation layer on which the second-layer power supply line is disposed, and a light emitting structure disposed on the second insulation layer and including a first electrode, a light emitting layer and a second electrode which is electrically connected to the second-layer power supply line.

In an exemplary embodiment, the display apparatus may include a circuit part thin film transistor ("TFT") disposed in a circuit part area which is between the first-layer power supply line and the display area. The second-layer power supply line may extend to a driver area.

In an exemplary embodiment, unevenness is provided on an upper surface of a portion of the second-layer power supply line in the driver area.

In an exemplary embodiment, unevenness may be provided on an upper surface of a portion of the first insulation layer contacting the second-layer power supply line. The unevenness of the second-layer power supply line may be corresponding to the unevenness of the first insulation layer.

In an exemplary embodiment, the first insulation layer and the second insulation layer may include organic insulation material.

In an exemplary embodiment, a voltage level of −3 volts (V) or less may be applied to the second electrode.

In an exemplary embodiment, unevenness may be provided on the second-layer power supply line.

In an exemplary embodiment, the display apparatus may further include a plurality of protrusions disposed between the first-layer power supply line and the second-layer power supply line. The plurality of protrusions may be disposed in the same layer as the first insulation layer.

In an exemplary embodiment, the display apparatus may further include a thin film encapsulation layer which includes a first inorganic layer disposed between the second-layer power supply line and the second electrode, a second inorganic layer disposed on the first inorganic layer, and an organic layer disposed between the first inorganic layer and the second inorganic layer.

In an exemplary embodiment, the display apparatus may further include a first insulation dam disposed on the second-layer power supply line, and a second insulation dam spaced apart from the first insulation dam, and has a height higher than the first insulation dam.

In an exemplary embodiment, the display apparatus may further include a pixel defining layer where the first insulation dam and the second insulation dam may include the same layer as any one or more layers of the first insulation layer, the second insulation layer, and the pixel defining layer.

In an exemplary embodiment, a power supply line may include the first-layer power supply line and the second-layer power supply line. The power supply line may extend along the peripheral area.

In an exemplary embodiment, unevenness may be provided on the first-layer power supply line.

In an exemplary embodiment, the display apparatus may further include an unevenness insulation pattern disposed between the first-layer power supply line and the substrate. Unevenness may be provided on the unevenness insulation pattern which contacts the first-layer power supply line, and the unevenness of the first-layer power supply line is corresponding to the unevenness of the unevenness insulation pattern.

In an exemplary embodiment, the display apparatus may further include a buffer layer disposed on the substrate, a circuit part active pattern of a circuit part TFT disposed on the buffer layer in the peripheral area, a gate insulation layer disposed on the buffer layer on which the circuit part active pattern is disposed, a gate pattern disposed on the gate insulation layer, and including a gate electrode of the circuit part TFT, an insulating interlayer disposed on the gate insulation layer on which the gate pattern is disposed, and a first data pattern disposed on the insulating interlayer, and including the first-layer power supply line.

In an exemplary embodiment, the display apparatus may further include a third insulation dam disposed on the buffer layer, and contacting the gate insulation layer and the insulating interlayer.

In an exemplary embodiment, the second-layer power supply line may be overlapped with the circuit part TFT.

According to an exemplary embodiment of the invention, a display apparatus includes a substrate, an unevenness insulation pattern disposed on the substrate in a peripheral area which surrounds a display area in which an image is displayed, a power supply line disposed on the unevenness insulation pattern, a first insulation layer disposed on the substrate on which the power supply line is disposed, and a light emitting structure disposed on the first insulation layer and including a first electrode, a light emitting layer and a second electrode which is electrically connected to the power supply line.

In an exemplary embodiment, unevenness corresponding to unevenness of unevenness insulation pattern may be provided on a portion of the power supply line which contacts the unevenness insulation pattern.

According to an exemplary embodiment of the invention, a display apparatus includes a substrate, a first-layer power supply line disposed on a substrate in a peripheral area which surrounds a display area in which an image is displayed, a first insulation layer on the substrate on which the first-layer power supply line is disposed, a second-layer power supply line disposed on the first insulation layer and the first-layer power supply line, and contacting the first-layer power supply line, a second insulation layer on the first insulation layer on which the second-layer power supply line is disposed, and a light emitting structure disposed on the second insulation layer and including a first electrode, a light emitting layer and a second electrode which is electrically connected to the second-layer power supply line. Unevenness is provided on the first-layer power supply line or the second-layer power supply line.

It is to be understood that both the foregoing general description and the following detailed description are exemplary and explanatory and are intended to provide further explanation of the invention as claimed.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
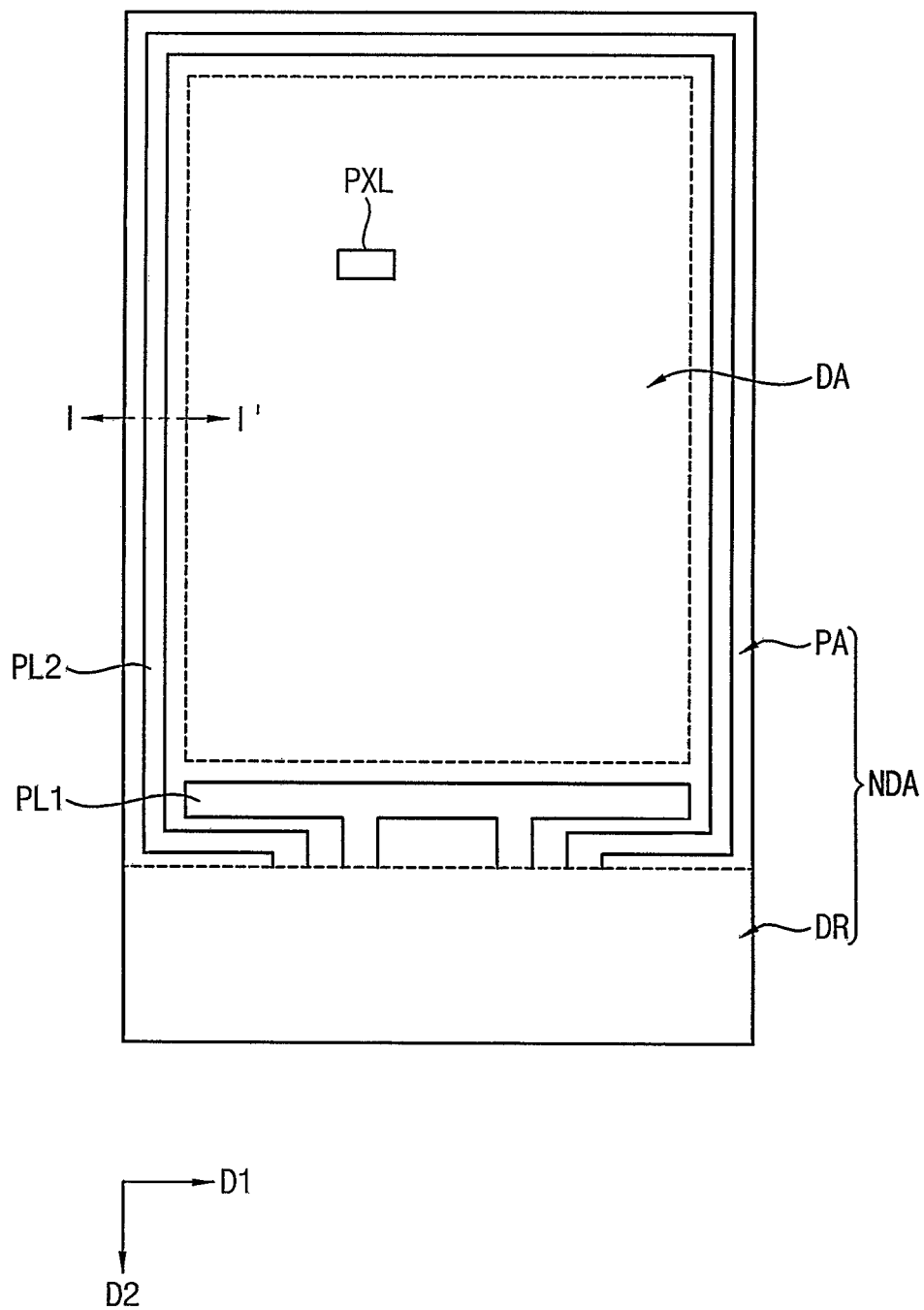
FIG. 1 is a plan view illustrating an exemplary embodiment of a display apparatus according to the invention.

Hereinafter, the invention will be explained in detail with reference to the accompanying drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an,"and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper." depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly, "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized exemplary embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display apparatus according to an exemplary embodiment of the invention.

Referring to FIG. 1, the display apparatus may include a display area DA, and a non-display area NDA which surrounds the display area DA. The non-display area NDA may include a peripheral area PA which is disposed immediately adjacent to the display area DA, and a driver area DR which is disposed adjacent to the peripheral area PA and below the display area DA.

The display apparatus may include a plurality of pixels not shown) disposed in the display area DA. The display apparatus may include a driver for driving the pixels disposed in the non-display area NDA and a power supply unit for supplying power to the pixels. The display apparatus may further include a wiring part connecting the pixels and the driver. In an exemplary embodiment, the driver may be disposed in the driver area DR, and the power supply unit may be disposed in the peripheral area PA and the driver area DR, for example.

Each pixel PXL is a minimum unit for displaying an image, and may be provided in the plural. The pixels PXL may include display elements that emit a color light. In an exemplary embodiment, the display element may be any one of a liquid crystal display ("LCD") device, an electrophoretic display ("EPD") device, an electrowetting display ("EWD") device and an organic light emitting diode ("OLED") device, for example.

Hereinafter, for convenience, the OLED device is explained as an example of the display element.

Each pixel PXL may emit one color among red, green and blue, but there is no limitation thereto. In an exemplary embodiment, each pixel PXL may emit a color such as cyan, magenta, yellow and white, etc., for example. The pixels will be described later in detail with reference to FIGS. 2 and 3B.

The power supply unit may include at least one power supply lin. In an exemplary embodiment, the power supply unit may include a first power supply line PL1 and a second power supply line PL2, for example. The first power supply line PL1 and the second power supply line PL2 may supply power to the pixels. The first power supply line PL1 may supply a first power ELVDD to the pixels, and the second power supply line PL2 may supply a second power ELVSS to the pixels.

The first power supply line PL1 may be disposed in the peripheral area PA disposed below the display area DA and may extend in the first direction D1.

The second power supply line PL2 may be disposed in the peripheral area PA which is disposed at an upper side, a left side, and a right side of the display area DA. The second power supply line PL2 may be disposed in the first direction D1 and a second direction D2 crossing the first direction D1 along the peripheral area PA.

The wiring part may provide signals of the driver to the pixels and may include scan lines, data lines, emission control lines, power supply lines, and initialization power supply lines, for example.

Figure 2:
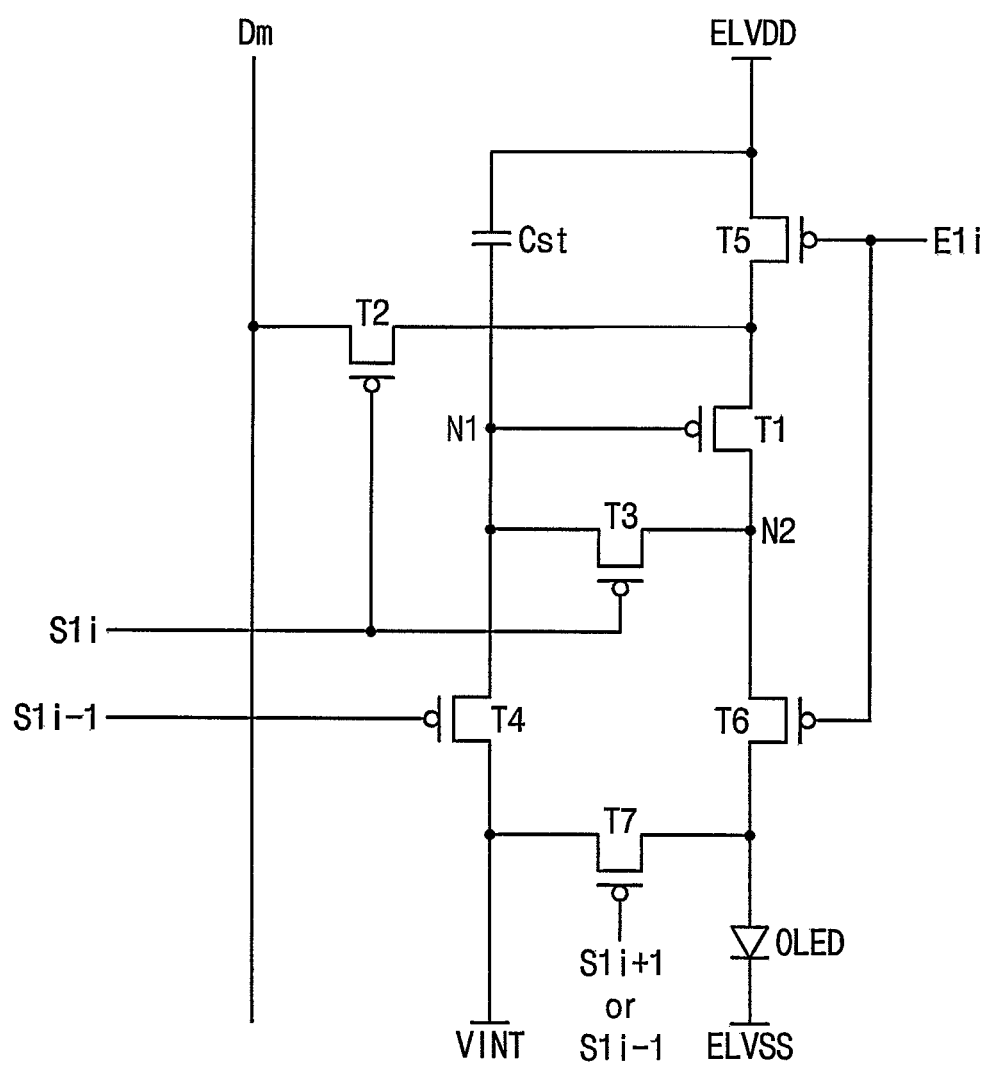
FIG. 2 is an equivalent circuit diagram illustrating an exemplary embodiment of a pixel shown in FIG. 1.

FIG. 2 is an equivalent circuit diagram illustrating an exemplary embodiment of a pixel shown in FIG. 1. In FIG. 2, for convenience of explanation, a pixel accessed to an m-th data line Dm and i-th first scan line S1$i$ are illustrated where m and i are natural numbers.

Referring to FIG. 2, the pixel according to the exemplary embodiment of the invention is provided with an OLED, a first transistor T1 to seventh transistor T7, and a storage capacitor Cst.

An anode of the OLED is accessed to the first transistor T1 via the sixth transistor T6, and a cathode of the OLED is accessed to the second power source ELVSS. Such an OLED generates light of a certain brightness that corresponds to the amount of current being supplied from the first transistor T1.

The first power source ELVDD may be set to a higher voltage than the second power source ELVSS such that current may flow to the OLED.

The seventh transistor T7 is accessed between an initializing power source Vint and the anode of the OLED. Further, the gate electrode of the seventh transistor T7 is accessed to the i-th first scan line S1$i$. Such a seventh transistor T7 is turned-on when the scan signal is being supplied to the i-th first scan line S1$i$, and provides the voltage of the initializing power source Vint to the anode of the OLED. Here, the initializing power source Vint may be set to a lower voltage than the data signal.

The sixth transistor T6 is accessed between the first transistor T1 and the OLED. Further, the gate electrode of the sixth transistor T6 is accessed to the i-th first light emission control line E1$i$. Such a sixth transistor T6 is turned-off when the light emission control signal is supplied to the i-th first light emission control line E1$i$, and in other cases, the sixth transistor T6 is turned-on.

The fifth transistor T5 is accessed between the first power source ELVDD and the first transistor T1. Further, a gate electrode of the fifth transistor T5 is accessed to the i-th first light emission control line E1i. Such a fifth transistor T5 is turned-off when the light emission control signal is being supplied to the i-th first light emission control line E1i, and in other cases the fifth transistor T5 is turned-on.

A first electrode of the first transistor T1 (driving transistor) is accessed to the first power source ELVDD via the fifth transistor T5, and a second electrode of the first transistor T1 is accessed to the anode of the OLED via the sixth transistor. Further, a gate electrode of the first transistor T1 is accessed to a first anode N1. Such a first transistor controls the amount of current flowing from the first power source ELVDD to the second power source ELVSS via the OLED in response to the voltage of the first node N1.

The third transistor T3 is accessed between the second electrode of the first transistor T1 and the first node N1. Further, a gate electrode of the third transistor T3 is accessed to the i-th first scan line S1i. Such a third transistor T3 is turned-on when a scan signal is being supplied to the i-th first scan line S1i, and electrically accesses the second electrode of the first transistor T1 and the first node N1. Therefore, when the third transistor T3 is turned-on, the first transistor T1 is accessed in a diode form.

The fourth transistor T4 is accessed between the first node N1 and the initializing power source Vint. Further, a gate electrode of the fourth transistor T4 is accessed to an i−1th first scan line S1i−1. Such a fourth transistor T4 is turned-on when a scan signal is being supplied to the i−1th first scan line S1i−1, and supplies the voltage of the initializing voltage Vint to the first node N1.

The second transistor T2 is accessed between the m-th data line Dm and the first electrode of the first transistor T1. Further, a gate electrode of the second transistor T2 is accessed to the i-th first scan line S1i. Such a second transistor T2 is turned-on when a scan signal is being supplied to the i-th first scan line S1i, and electrically accesses the m-th data line Dm and the first electrode of the first transistor T1.

The storage capacitor Cst is accessed between the first power source ELVDD and the first node N1. Such a storage capacitor Cst stores a data signal and a voltage corresponding to a threshold voltage of the first transistor T1.

Figure 3A:
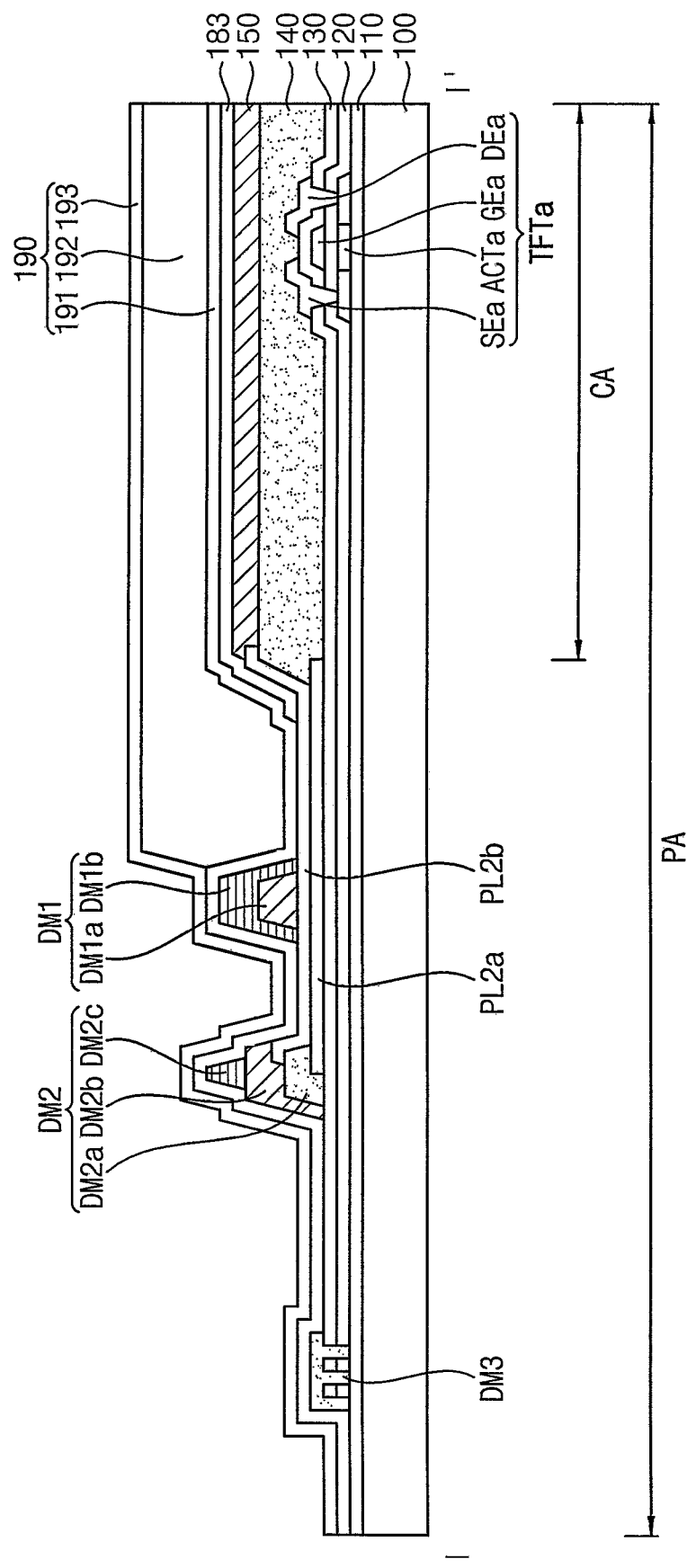
FIG. 3A is a cross-sectional view taken along line I-I' of FIG. 1.
Figure 3B:
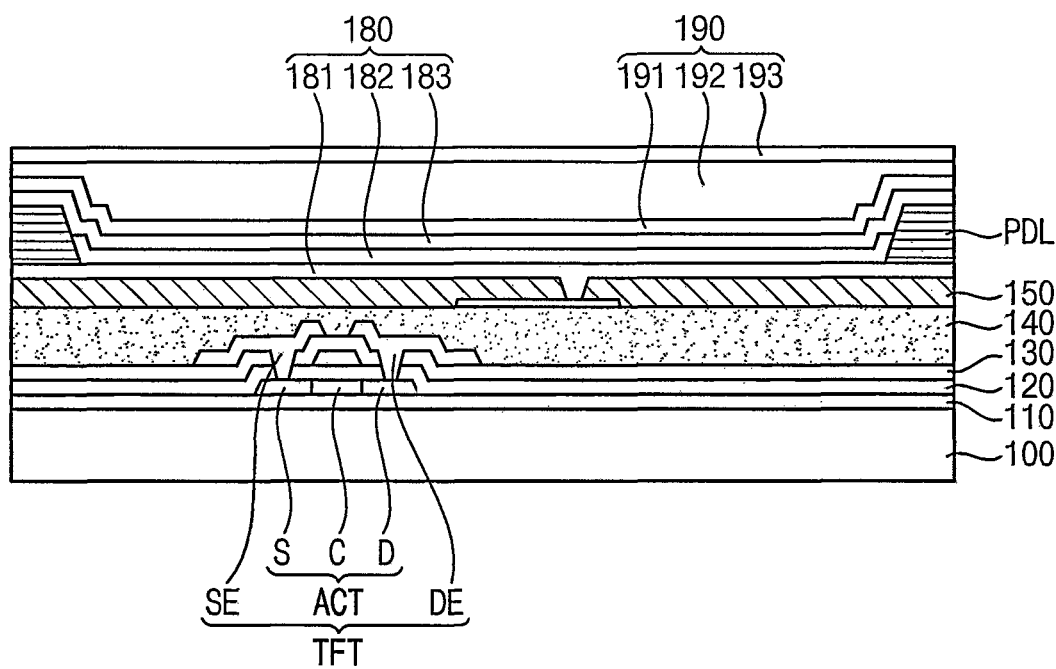
FIG. 3B is a cross-sectional view of the display apparatus at a portion corresponding to the pixel of FIG. 2.

FIG. 3A is a cross-sectional view taken along line I-I' of FIG. 1. FIG. 3B is a cross-sectional view of the display apparatus at a portion corresponding to the pixel of FIG. 2.

Referring to FIG. 3B, in the display area DA, the display apparatus may include a substrate 100, a buffer layer 110, an active pattern ACT, a gate insulation layer 120, a gate pattern, an insulating interlayer 130, a first data pattern, a first insulation layer 140, a second data pattern, a second insulation layer 150. a pixel defining layer PDL, a light emitting structure 180 and a thin film encapsulation layer 190.

The substrate 100 including transparent or opaque insulation materials may be provided. In an exemplary embodiment, the substrate 100 may include a quartz substrate, a synthetic quartz substrate, a calcium fluoride substrate, a fluoride-doped quartz substrate, a sodalime glass substrate, a non-alkali glass substrate etc., for example. In an alternative exemplary embodiment, the substrate 100 may include a flexible transparent material such as a flexible transparent resin substrate (e.g., a polyimide substrate).

The buffer layer 110 may be disposed on the substrate 100. The buffer layer 110 may be disposed on the entire substrate 100. The buffer layer 110 may prevent the diffusion of metal atoms and/or impurities from the substrate 100 into the active pattern ACT. In addition, the buffer layer 110 may control a rate of a heat transfer in a crystallization process for forming the active pattern ACT, thereby obtaining substantially uniform the active pattern ACT.

The active pattern ACT may be disposed on the buffer layer 110. The active pattern ACT may include amorphous silicon or polycrystalline silicon. In some exemplary embodiment, the active pattern ACT may include oxide of at least one substance selected from the group including indium (In), gallium (Ga), stannum (Sn), zirconium (Zr), vanadium (V), hafnium (Hf), cadmium (Cd), germanium (Ge), chromium (Cr), titanium (Ti), and zinc (Zn), for example. The active pattern ACT may include a source region S and a drain region D doped with an impurity, and a channel region C disposed between the source region S and the drain region D.

The gate insulation layer 120 may be disposed on the buffer layer 110. The gate insulation layer 120 may be uniformly disposed on the buffer layer 110 along a profile of the active pattern ACT. In an exemplary embodiment, the gate insulation layer 120 may include a silicon compound, metal oxide, etc., for example.

The gate pattern may be disposed on the gate insulation layer 120. The gate pattern may include a gate electrode GE, and a signal line such as a gate line. In an exemplary embodiment, the gate pattern may be provided using metal, alloy, metal nitride, conductive metal oxide, transparent conductive material, etc., for example.

The insulating interlayer 130 may be disposed on the gate insulation layer 120 on which the first gate pattern is disposed. In an exemplary embodiment, the insulating interlayer 130 may be uniformly disposed on the gate insulation layer 120 along a profile of the gate pattern. Here, the insulating interlayer 130 may have a substantially small thickness, such that a stepped portion may be provided at a portion of the insulating interlayer 130 adjacent to the gate pattern. In some exemplary embodiment, the insulating interlayer 130 may have a relatively large thickness for sufficiently covering the gate pattern, so that the insulating interlayer 130 may have a substantially level surface. The insulating interim er 130 may include a silicon compound, a metal oxide, or the like. The insulating interlayer 130 may include a plurality of layers.

The first data pattern may be disposed on the inter layer dielectric layer 130. The first data pattern may include a source electrode SE and a drain electrode DE of a thin film transistor TFT, a first-layer-second power supply line PL2a of a first-layer power supply line, and a signal line such as a data line. The first data pattern may be provided using metal, alloy, metal nitride, conductive metal oxide, transparent conductive material, etc. In an exemplary embodiment, the first data pattern may be a laminated structure including a first layer including titanium (Ti), a second layer including aluminum (Al), and a third layer including titanium (Ti), for example.

The active pattern ACT, the gate electrode GE, the source electrode SE and the drain electrode DE may form the thin film transistor TFT. In an exemplary embodiment, the thin film transistor TFT may be any one of the first to seventh transistors (refer to T1 to T7 in FIG. 2) included in the pixel.

The first insulation layer 140 may be disposed on the insulating interlayer 130 on which the first data pattern is disposed. The first insulation layer 140 may have a single-layered structure or a multi-layered structure including at least two insulation films. The first insulation layer 140 may be provided using an organic material. In an exemplary embodiment, the first insulation layer 140 may include photoresist, acryl-based resin, polyimide-based resin, polyamide-based resin, siloxane-based resin, etc., for example.

The second data pattern may be disposed on the first insulation layer 140. The second data pattern may include a second-layer-second power supply line PL2*b* of a second-layer power supply line and a signal line such as a data line. In an exemplary embodiment, the second data pattern may be provided using metal, alloy, metal nitride, conductive metal oxide, transparent conductive material, etc., for example. In an exemplary embodiment, the second data pattern may be a laminated structure including a first layer including titanium (Ti), a second layer including aluminum (Al), and a third layer including titanium (Ti), for example.

The second insulation layer 150 may be disposed on the first insulation layer 140 on which the second data pattern is disposed. The second insulation layer 150 may have a single-layered structure or a multi-layered structure including at least two insulation films. The second insulation layer 150 may be provided using an organic material. In an exemplary embodiment, the first insulation layer 140 may include photoresist, acryl-based resin, polyimide-based resin, polyamide-based resin, siloxane-based resin, etc., for example. In some exemplary embodiments, the second insulation layer 150 may be provided using an inorganic material such as a silicon compound, a metal, or a metal oxide, for example.

The light emitting structure 180 may include a first electrode 181, an emission layer 182 and a second electrode 183.

The first electrode 181 may be disposed on the second insulation layer 150. The first electrode 181 may include a reflective material or a transmissive material in accordance with the emission type of the display apparatus. In an exemplary embodiment, the first electrode 181 may be provided using aluminum, alloy including aluminum, aluminum nitride, silver, alloy including silver, tungsten, tungsten nitride, copper, alloy including copper, nickel, alloy including nickel, chrome, chrome nitride, molybdenum, alloy including molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc., for example. These may be used alone or in a combination thereof. In exemplary embodiments, the first electrode 181 may have a single layer structure or a multi-layer structure, which may include a metal film, an alloy film, a metal nitride film, a conductive metal oxide film and/or a transparent conductive film.

The pixel defining layer PDL may be disposed on the second insulation layer 150 on which the first electrode 181 is disposed. The pixel defining layer PDL may be provided using an organic material. In an exemplary embodiment, the pixel defining layer PDL may include photoresist, acryl-based resin, polyimide-based resin, polyamide-based resin, siloxane-based resin, etc., for example. In some exemplary embodiments, an opening which exposes the first electrode 181 may be defined by etching the pixel defining layer PDL. An emitting area and a non-emitting area of the display apparatus may be defined by the opening of the pixel defining layer PDL. In an exemplary embodiment, a portion where the opening of the pixel defining layer PDL is located may correspond to the emitting area, and the non-emitting area may correspond to a portion adjacent to the opening of the pixel defining layer PDL, for example.

The light emitting layer 182 may be disposed on the first electrode 181 exposed through the opening of the pixel defining layer PDL. In addition, the light emitting layer 182 may extend on a sidewall of the opening of the pixel defining layer PDL. In some exemplary embodiments, the light emitting layer 182 may include an organic light emitting layer ("EL"), a hole injection layer ("HIL"), a hole transport layer ("HTL"), an electron transport layer ("ETL"), an electron injection layer ("EIL"), etc. In some exemplary embodiments, except for the organic emission layer, the HIL, the HTL, the ETL, and the EIL may be provided in common to correspond to a plurality of pixels. In some exemplary embodiments, a plurality of ELs may be provided using light emitting materials for generating different colors of light such as a red color of light, a green color of light and a blue color of light in accordance with color pixels of the display device. In some exemplary embodiments, the EL of the of the light emitting layer 182 may include a plurality of stacked light emitting materials for generating a red color of light, a green color of light and a blue color of light to thereby emitting a white color of light. Here, elements of the light emitting layer 182 are commonly provided so as to correspond to a plurality of pixels, and each pixel may be divided by a color filter layer.

The second electrode 183 may be disposed on the pixel defining layer PDL and the light emitting layer 182. The second electrode 183 may include a transmissive material or a reflective material in accordance with the emission type of the display device. In an exemplary embodiment, the second electrode 183 may be provided using aluminum, alloy including aluminum, aluminum nitride, silver, alloy including silver, tungsten, tungsten nitride, copper, alloy including copper, nickel, alloy including nickel, chrome, chrome nitride, molybdenum, alloy including molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc., for example. These may be used alone or in a combination thereof. In exemplary embodiments, the second electrode 183 may also have a single layer structure or a multi-layer structure, which may include a metal film, an alloy film, a metal nitride film, a conductive metal oxide film and/or a transparent conductive film.

The thin film encapsulation layer 190 may be disposed on the second electrode 183. The thin film encapsulation layer 190 may prevent penetration of moisture and oxygen from outside. The thin film encapsulation layer 190 may include a first inorganic layer 191, an organic layer 192, and a second inorganic layer 193. The first inorganic layer 191, the organic layer 192, and the second inorganic layer 193 may be sequentially stacked on the second electrode 183.

Here, the thin film encapsulation layer 190 may include at least one organic layer and at least one inorganic layer alternately stacked with each other. In the illustrated exemplary embodiment, the thin film encapsulation layer 190 includes the first and second inorganic layers and one organic layer therebetween, but the invention is not limited thereto.

Referring to FIG. 3A, in the peripheral area PA, the display apparatus may include the substrate 100 the buffer layer 110, a driver active pattern ACTa, the gate insulating layer 120, the gate pattern, the insulating interlayer 130, the first data pattern, the first insulation layer 140, the second data pattern, the second insulation layer 150, a first insulation dam DM1, a second insulation dam DM2, a third insulation dam DM3, and the thin film encapsulation layer 190.

The buffer layer 10 may be provided to an edge of the substrate 100 (left side of the drawing). The driver active pattern ACTa may be disposed on the buffer layer 110.

The gate insulation layer 120 may be disposed on the buffer layer 110 on which the driver active pattern ACTa is disposed. The gate insulation layer 120 may not be provided to an edge of the substrate 100 but may be provided only up to the third insulation dam DM3.

The gate pattern may be disposed on the gate insulation layer 120. The gate pattern may further include a driver gate electrode GEa.

The insulating interlayer 130 may be disposed on the gate insulation layer 120 on which the gate pattern is disposed. The insulating interlayer 130 may not be provided to the edge of the substrate 100 but may be provided only up to the third insulating dam DM3.

The third insulation dam DM3 may be disposed on the buffer layer 110 on which the insulating interlayer 130 is disposed. The third insulation dam DM3 is a structure for preventing a crack from being transmitted to the display area DA (refer to FIG. 1) through inorganic film layers due to physical damage by an external impact. The third insulation dam DM3 may be disposed in the same layer as the first insulation layer 140 or the second insulation layer 150. The third insulation dam DM3 may contact the insulating interlayer 130 and the gate insulation layer 120.

The first data pattern may be disposed on the insulating interlayer 130. The first data pattern may further include a driver source electrode SEa and a driver drain electrode DEa of the circuit part thin film transistor TFTa and a first-layer-second power supply line PL2a.

The first insulation layer 140 may be disposed on the insulating interlayer 130 in which the first data pattern is disposed.

The second data pattern may be disposed on the first insulation layer 140. The second data pattern may further include a second-layer-second power supply line PL2b. The first-layer-second power supply line PL2a is not covered by the first insulation layer 130, and a portion of the first-layer-second power supply line PL2a may be exposed so that the first-layer-second power supply line PL2a may contact the second-layer-second power supply line PL2b. That is, the first-layer-second power supply line PL2a and the second-layer-second power supply PL2b may contact each other in the peripheral area DA and may form a double wiring. Accordingly, a width of the second power supply line PL2 may be reduced, and wiring resistance of the second power supply line PL2 may be reduced while reducing a width of the peripheral area PA.

Particularly when an absolute value of the voltage applied to the second power supply line PL2 increases to increase brightness of the display apparatus, power consumption increases and a problem of degradation in display quality due to wiring resistance of the second power supply line PL2 is highlighted. According to the illustrated exemplary embodiment, since the width of the peripheral area PA may be reduced while the wiring resistance of the second power supply line PL2 is reduced, the display quality may be improved.

Table 1 below is a simulation value and an actual value showing that the absolute value of a second power supply voltage level desired is large when the brightness of the display apparatus is increased from about 420 nits to about 700 nits.

TABLE 1

| sample | width of peripheral area | with of second power supply line | second power supply voltage level (simulation) | | second power supply voltage level (actual) | |
|---|---|---|---|---|---|---|
| | | | 420 nit | 700 nit | 420 nit | 700 nit |
| No. 1 | 1.2 | 0.349 | −2.83 | −4.14 | −2.7 | −4.1 |
| No. 2 | 0.99 | 0.222 | −2.9 | −4.43 | — | — |

Here, as the second power supply voltage level is lower (the larger the absolute value is), the power consumption in the second power supply line increases, and the wiring resistance of the second power supply line may be lowered and the influence thereof may be reduced.

The second insulation layer 150 may be disposed on the first insulation layer 140 on which the second data pattern is disposed. The second electrode 183 may be disposed on the second insulation layer 150 and the second layer-second power supply line PL2b to be electrically connected to the second layer-second power supply line PL2b.

The first insulation dam DM1 may be disposed on the second-layer-second power supply line PL2b. The first insulation dam DM1 may be disposed on the second-layer-second power supply line PL2b. A second insulation dam DM2 spaced apart from the first insulation dam DM1 and having a height higher than the first insulation dam DM1 may be disposed adjacent to the first-layer-second power supply line PL2a on the insulating interlayer. The first insulation dam DM1 may be arranged to surround the display area DA. The second insulation dam DM2 may be spaced apart from the first insulation dam DM1 and arranged to surround the first insulation dam DM1.

The first insulation dam DM1 and the second insulation dam DM2 may be disposed in the same layer as any one or more layers of the first insulation layer 140, the second insulation layer 150, and the pixel defining layer PDL.

In an exemplary embodiment, the first insulation dam DM1 may include a first portion DM1a and a second portion DM1b disposed on the first portion DM1a, for example. The first portion DM1a may be disposed in the same layer as the second insulating layer 150, and the second portion DM1b may be disposed in the same layer as the pixel defining layer PDL.

In an exemplary embodiment, the second insulation dam DM2 may include a first portion DM2a, a second portion DM2b disposed on the first portion DM2a, and a third portion DM2c disposed on the second portion DM2a, for example. The first portion DM2a may be disposed in the same layer as the first insulation layer 140, the second portion DM2b may be disposed in the same layer as the second insulating layer 150, and the third portion DM2c may be disposed in the same layer as the pixel defining layer PDL.

The first and second insulation dams DM1 and DM2 may prevent organic material of the organic layer 192 of the thin film encapsulation layer 190 which seals the display area DA from flowing in an edge direction of the substrate 100. Thus, it is possible to prevent formation of an edge tail of the organic material. Here, the edge tail refers to an edge of the organic layer is provided to flow outward beyond an edge of the inorganic layer. Generally, in order to form the thin film encapsulation layer 190, when an organic layer and an inorganic layer are provided, a pattern is provided by placing a mask corresponding to the layer on the substrate. At this time, the organic layer penetrates into a gap between the mask and the substrate, and the edge tail is well provided. In this case, oxygen or moisture may penetrate into structures in the display area DA through the edge tail, thereby deteriorating display quality.

The thin film encapsulation layer 190 including the first inorganic layer 191, the organic layer 192 and the second inorganic layer 193 may be disposed on the substrate 100 on which the second electrode 183 is disposed. The organic layer 192 may be provided from the display area DA to the first insulation dam DM1.

The circuit part thin film transistor TFTa may be disposed in a circuit part area CA between the first-layer-second power supply line PL2a and the display area DA. The circuit part area CA may be disposed adjacent to the display DA. The peripheral area PA may include the circuit part area CA. In addition to the circuit part thin film transistor TFTa, a circuit and a wiring for driving the display apparatus may be provided in the circuit part area CA.

According to the illustrated exemplary embodiment, the second power supply line may be provided as a double wiring by the first data pattern and the second data pattern, so that the width of the second power supply wiring ay be reduced, and the wiring resistance of the second power supply wiring may be reduced while reducing the width of the peripheral area.

Particularly, when an absolute value of the voltage applied to the second power supply line increases to increase brightness of the display apparatus, power consumption increases and a problem of degradation in display quality due to wiring resistance of the second power supply line is highlighted. According to the illustrated exemplary embodiment, since the width of the peripheral area may be reduced while the wiring resistance of the second power supply Line is reduced, the display quality may be improved.

Especially, when the voltage level of −3 volts (V) or less is applied to the second electrode of the light emitting structure, the influence due to the wiring resistance is minimized, so that the display quality may be improved compared with the conventional structure.

Although not shown, the first power supply line PL1 may have a structure similar to the second power supply line PL2.

Figure 4A:
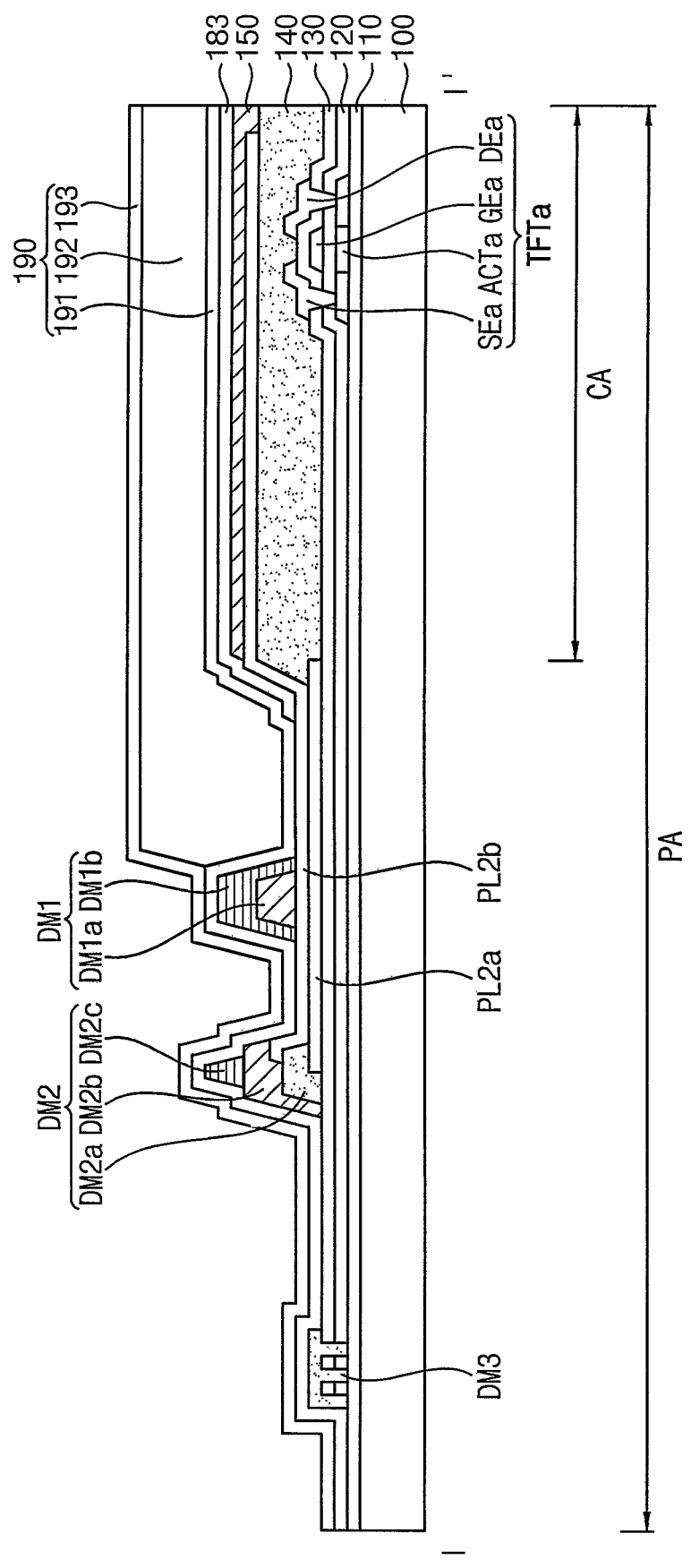
FIG. 4A is a cross-sectional view illustrating an exemplary embodiment of a display apparatus according to the invention.
Figure 4B:
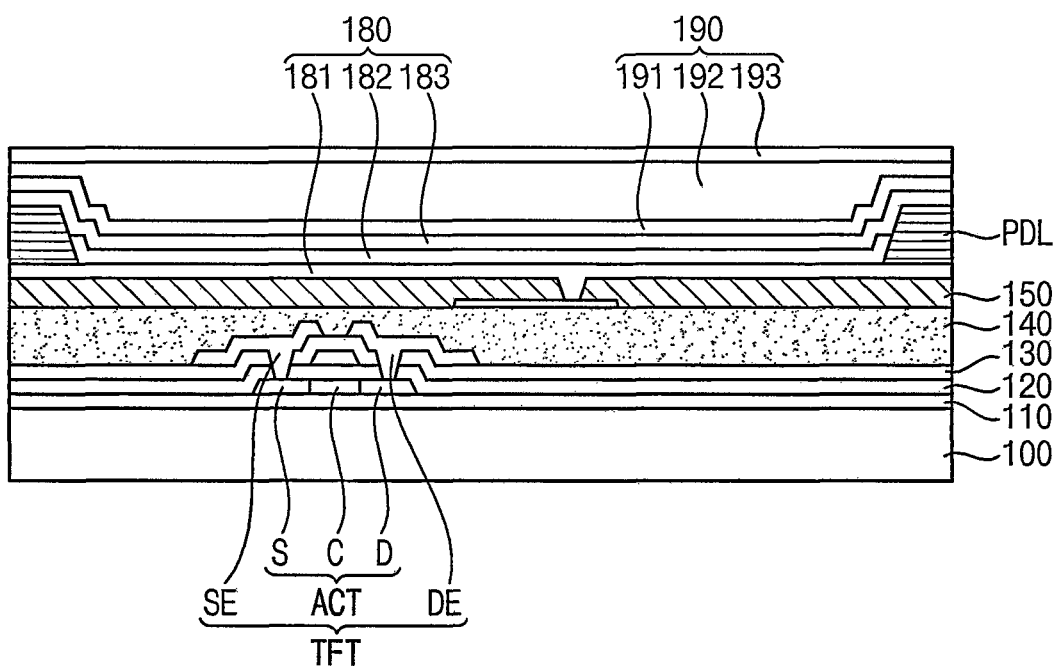
FIG. 4B is a cross-sectional view of the display apparatus at a portion corresponding to a pixel of FIG. 4A.

FIG. 4A is a cross-sectional view illustrating a display apparatus according to an exemplary embodiment of the invention. FIG. 4B is a cross-sectional view of the display apparatus at a portion corresponding to a pixel of FIG. 4A. Since the display apparatus is substantially the same as the display apparatus of FIGS. 3A and 3B except for the second-layer-second power supply line PL2b, repeated description will be omitted.

Referring to FIGS. 4A and 4B, in the display area DA (refer to FIG. 1), the display apparatus may include a substrate 100, a buffer layer 110, an active pattern ACT, a gate insulation layer 120, a gate pattern, an insulating interlayer 130, a first data pattern, a first insulation layer 140, a second data pattern, a second insulation layer 150, a pixel defining layer PDL, a light emitting structure 180 and a thin film encapsulation layer 190.

The first data pattern may include a circuit part source electrode SEa and a circuit part drain electrode DEa of a circuit part thin film transistor TFTa, and a first-layer-second power supply line PL2a. The second data pattern may include a second-layer-second power supply line PL2b.

Here, the second-layer-second power supply line PL2b may extend to a circuit part area CA in which the circuit part thin film transistor TFTa is provided. Accordingly, a portion of the second-layer-second power supply line PL2b may be disposed in the circuit part area CA to overlap with the circuit part thin film transistor TFTa.

According to the illustrated exemplary embodiment, since the second power supply lines forms a double wiring and further extends to the circuit part area, wiring resistance reduction effect may be further increased.

Figure 5A:
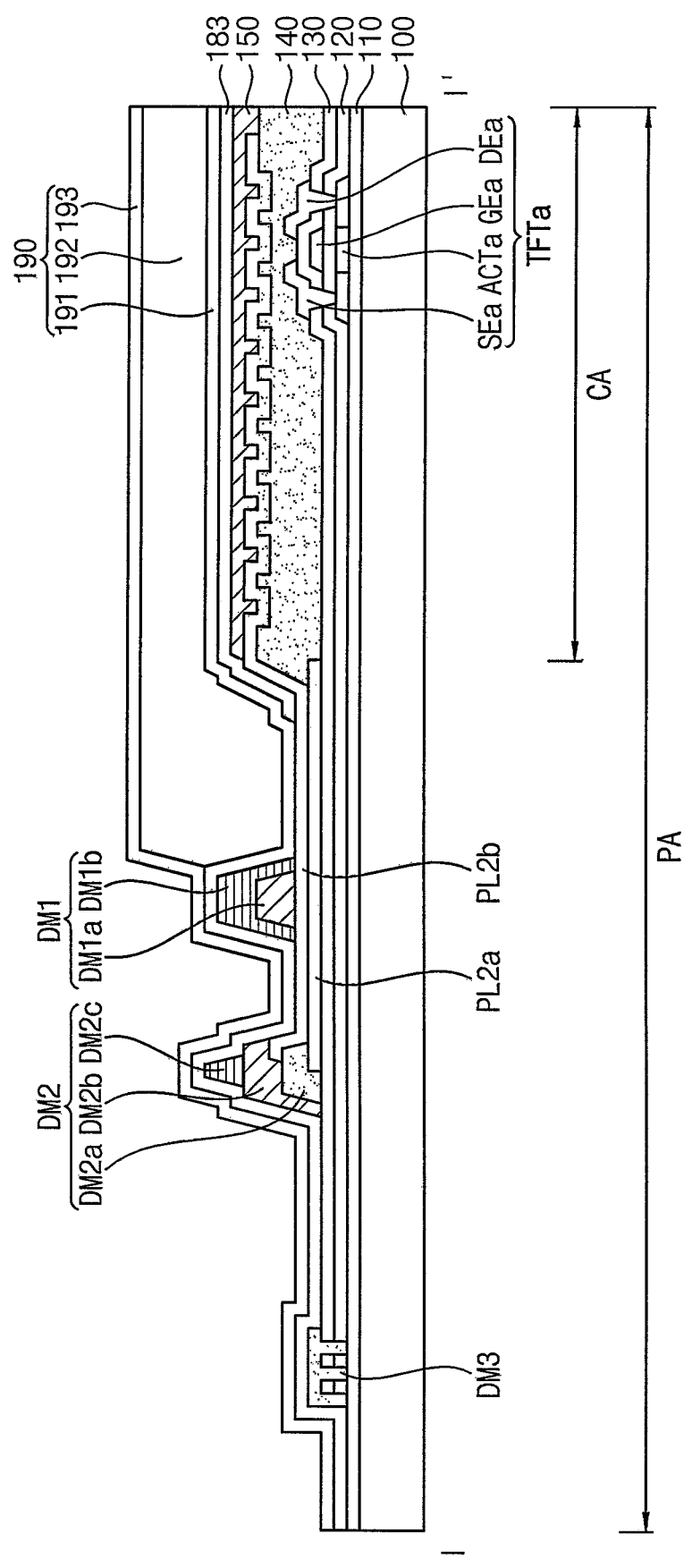
FIG. 5A is a cross-sectional view illustrating an exemplary embodiment of a display apparatus according to the invention.
Figure 5B:
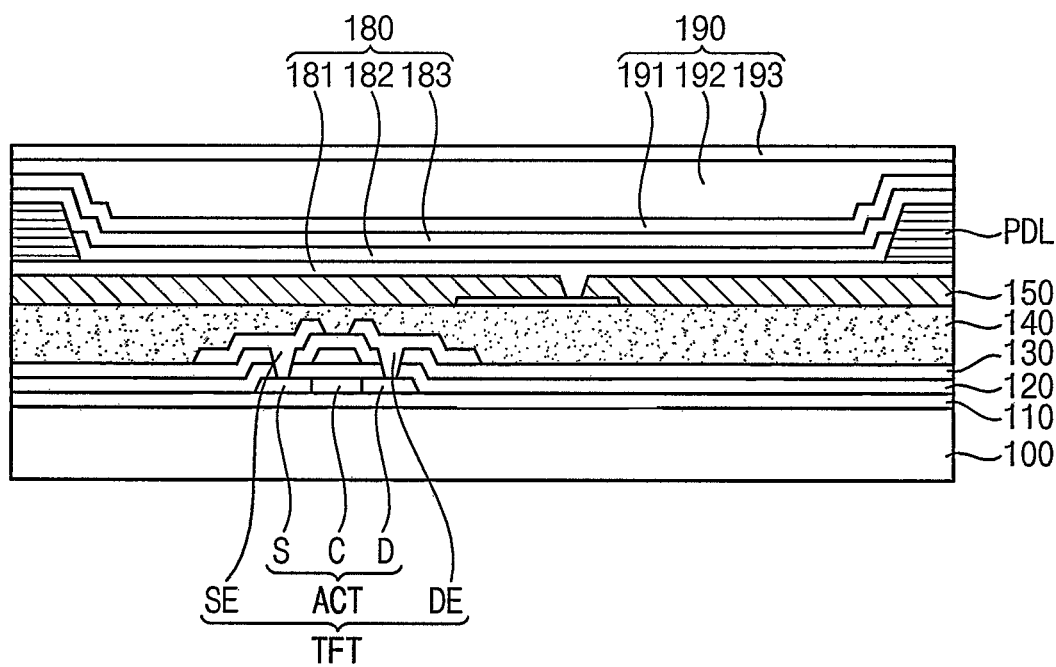
FIG. 5B is a cross-sectional view of the display apparatus at a portion corresponding to a pixel of FIG. 5A.

FIG. 5A is a cross-sectional view illustrating a display apparatus according to an exemplary embodiment of the invention. FIG. 5B is a cross-sectional view of the display apparatus at a portion corresponding to a pixel of FIG. 5A. The display apparatus is substantially the same as the display apparatus of FIGS. 4A and 4B except for the unevenness of a second-layer-second power supply line PL2b, and thus repeated description will be omitted.

Referring to FIGS. 5A and 5B, in a display area DA, the display apparatus may include a substrate 100, a buffer layer 110, an active pattern ACT, a gate insulation layer 120, a gate pattern, an insulating interlayer 130, a first data pattern, a first insulation layer 140, a second data pattern, a second insulation layer 150, a pixel defining PDL, a light emitting structure 180 and a thin film encapsulation layer 190.

In a peripheral area PA, the display apparatus rimy include the substrate 100, the buffer layer 110, the circuit part active pattern ACTa, the gate insulation layer 120, the gate pattern, the insulating interlayer 130, the first data pattern, the first insulation layer 140, the second data pattern, the second insulation layer 150, the first insulation dam DM1, the second insulation dam DM2, the third insulation dam DM3 and the thin film encapsulation layer 190.

The first data pattern may include a circuit part source electrode SEa and a circuit part drain electrode DEa of a circuit part thin film transistor TFTa, and a first-layer-second power supply line PL2a. The second data pattern may include a second-layer-second power supply line PL2b.

Here, the second-layer-second power supply line PL2b may extend to a circuit part area. CA in which the circuit part thin film transistor TFTa is provided. Accordingly, a portion of the second-layer-second power supply line PL2b may be disposed in the circuit part area CA to overlap with the circuit part thin film transistor TFTa.

Unevenness may be provided on the second-layer-second power supply line PL2b in the circuit part area CA. Thus, a plurality of grooves may be defined in upper and lower surfaces of the second layer-second power supply line PL2b so that the upper and lower surfaces may form an uneven surface. As a result, an area of the second-line second power supply line PL2b increases, thereby further reducing the wiring resistance.

At this time, unevenness is provided on an upper surface of the first insulation layer 140 contacting the second-layer-second power supply line PL2b, and unevenness of the second-layer-second power supply line PL2b may be provided corresponding to the unevenness on the upper surface of the first insulation layer 140.

The unevenness on the upper surface of the first insulation layer 140 may be provided by various methods. In an exemplary embodiment, when the first insulation layer 140 is provided, a photoresist material may be used, for example. By varying the amount of exposure using slit masks or halftone masks in various portions of the first insulation layer 140 whose top surface is still substantially flat during the manufacturing process, a specific portion is etched relatively more than the other portion. Here, the more etched portions may be understood as concave portions on the upper surface of the first insulation layer 140. The method used in manufacturing the display apparatus according to the illustrated exemplary embodiment is not limited to such a method. In an exemplary embodiment, the first insulation layer 140 having a substantially flat top surface may be provided and then only a specific portion may be removed by a dry etching method or the like, for example, According to the illustrated exemplary embodiment, since the second power supply line forms a double wiring and further extends to the circuit part area, and unevenness is provided thereon, so that the wiring resistance reduction effect may be further increased.

Figure 6A:
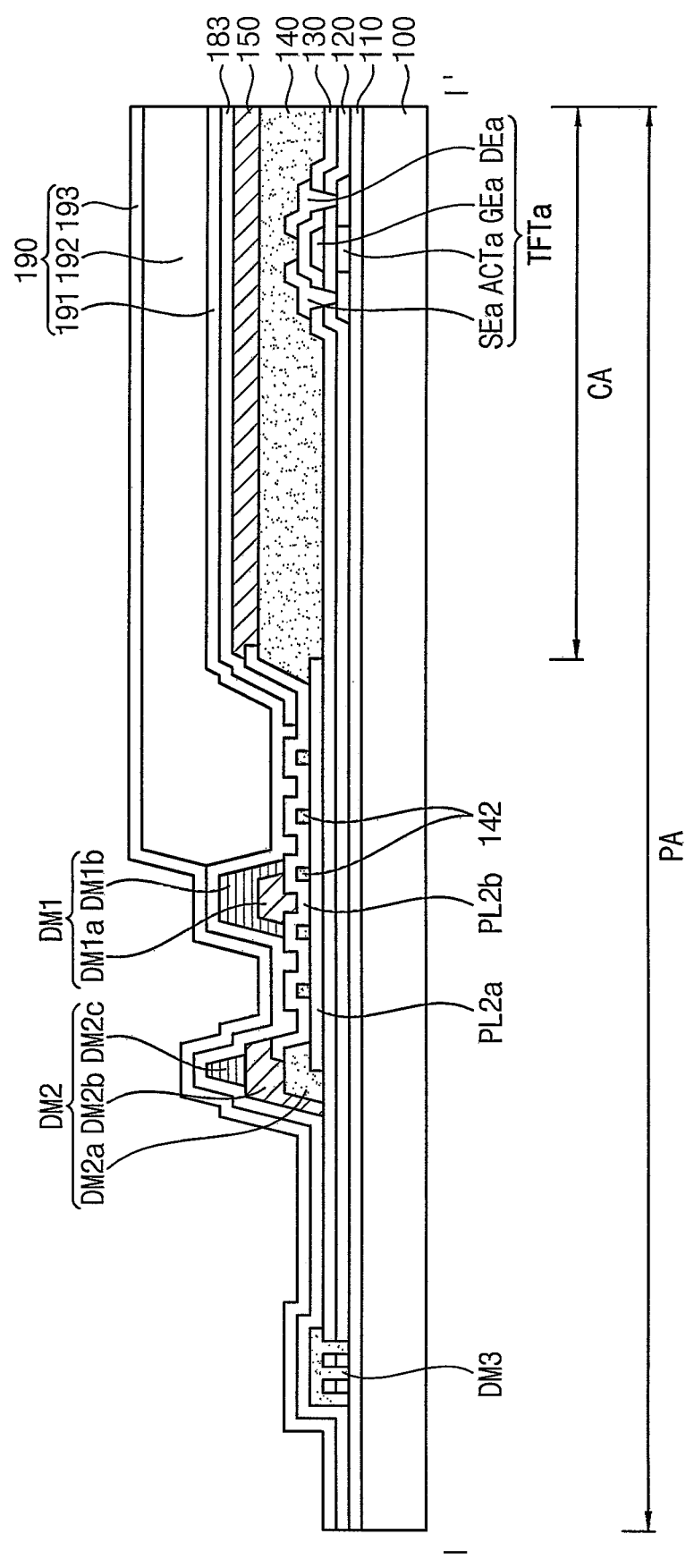
FIG. 6A is a cross-sectional view illustrating an exemplary embodiment of a display apparatus according to the invention.
Figure 6B:
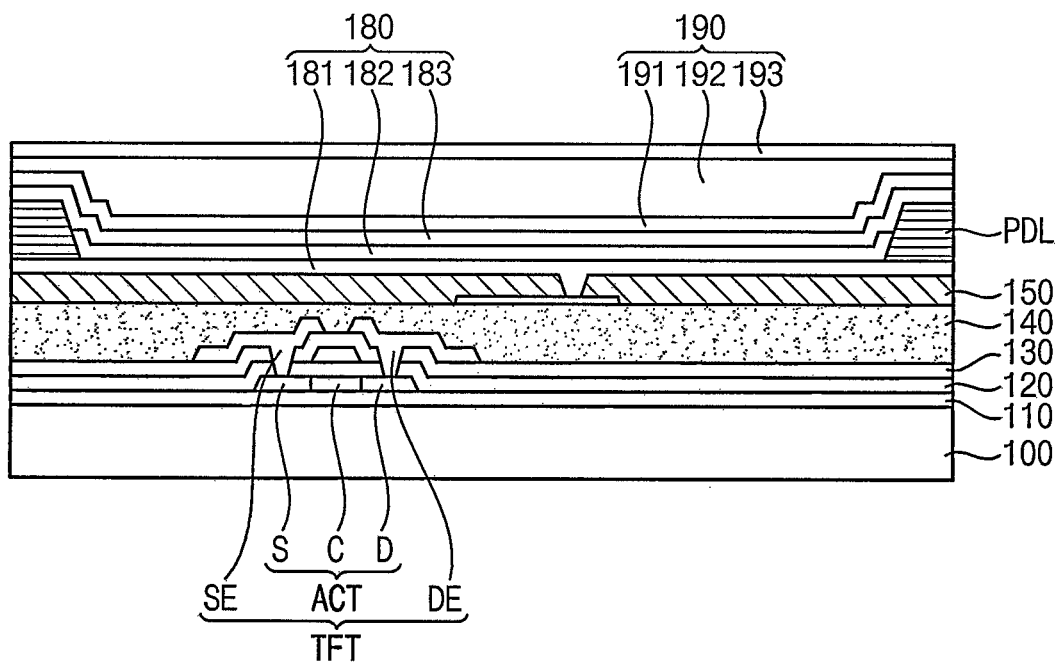
FIG. 6B is a cross-sectional view of the display apparatus at a portion corresponding to a pixel of FIG. 6A.

FIG. 6A is a cross-sectional view illustrating a display apparatus according to an exemplary embodiment of the invention. FIG. 6B is a cross-sectional view of the display apparatus at a portion corresponding to a pixel of FIG. 6A. The display apparatus is substantially the same as the display apparatus of FIGS. 3A and 3B except for the unevenness of a second-layer-second power supply line PL2*b*, and thus repeated description will be omitted.

Referring to FIGS. 6A and 6B, in a display area DA, the display apparatus may include a substrate 100, a buffer layer 110, an active pattern ACT, a gate insulation layer 120, a gate pattern, an insulating interlayer 130, a first data pattern, a first insulation layer 140, a second data pattern, a second insulation layer 150, a pixel defining layer PDL, a light emitting structure 180 and a thin film encapsulation layer 190.

In a peripheral area PA, the display apparatus may include the substrate 100, the buffer layer 110, the circuit part active pattern ACTa, the gate insulation layer 120, the gate pattern, the insulating interlayer 130, the first data pattern, the first insulation 140, the second data pattern, the second insulation layer 150, the first insulation dam DM1, the second insulation dam DM2, the third insulation dam DM3 and the thin film encapsulation layer 190.

The first data pattern may include a circuit part source electrode SEa and a circuit part drain electrode DEa of a circuit part thin film transistor TFTa, and a first-layer-second power supply line PL2*a*. The second data pattern may include a second-layer-second power supply line PL2*b*.

The second-layer-second power supply line PL2*b* may be provided with unevenness. In other words, a plurality of grooves may be defined in upper and lower surfaces of the second-layer-second power supply line PL2*b* so that the upper and lower surfaces of the second-layer-second power supply line PL2*b* may form uneven surfaces. As a result, area of the second-layer-second power supply line PL2*b* increases, thereby further reducing the wiring resistance.

At this time, a plurality of protrusions 142 may be disposed between the first-layer-second power supply line PL2*a* and the second-layer-second power supply line PL2*b*. The plurality of protrusions 142 may be spaced apart from each other and may be patterned from the same layer as the first insulation layer 140. The plurality of protrusions 142 may form an uneven surface on the first-layer-second power supply line PL2*a*, thereby forming unevenness on the second-layer-second power supply line PL2*b*. That is, the unevenness of the second layer-second power supply line PL2*b* may be provided corresponding to the protrusions.

Figure 7A:
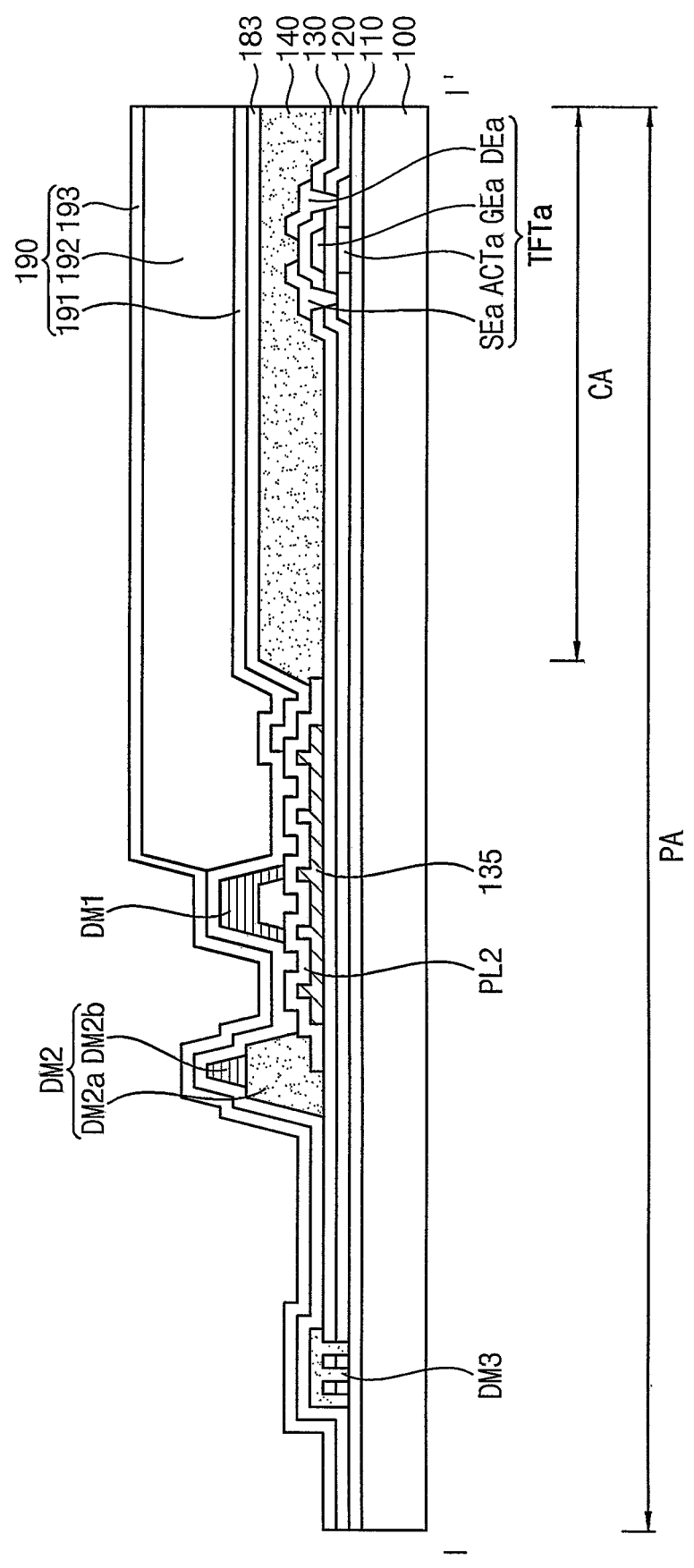
FIG. 7A is a cross-sectional view illustrating an exemplary embodiment of a display apparatus according to the invention.
Figure 7B:
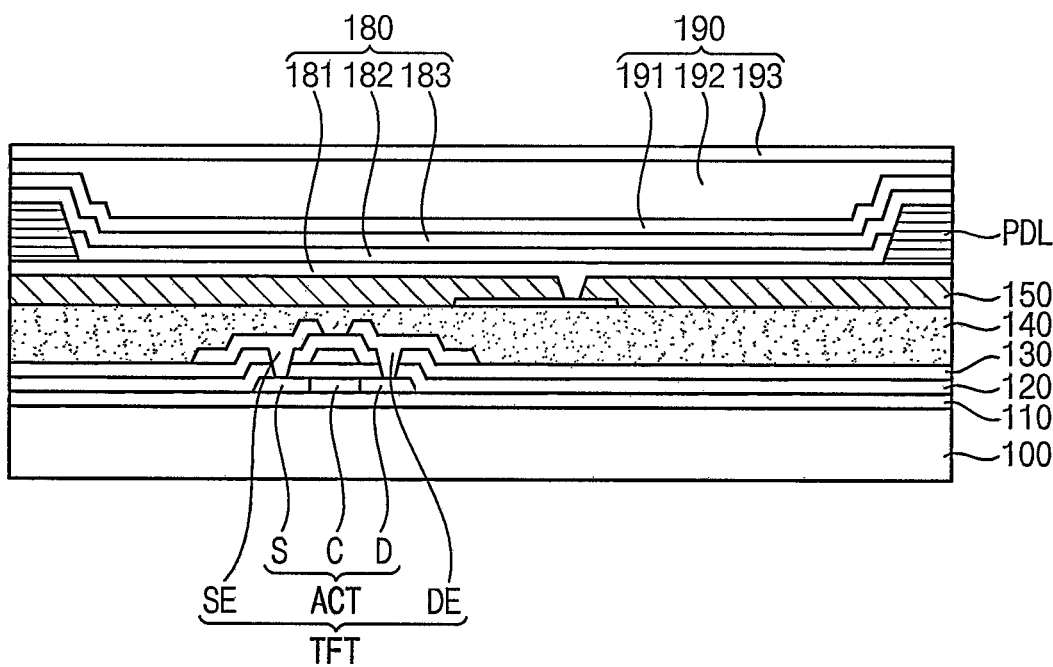
FIG. 7B is a cross-sectional view of the display apparatus at a portion corresponding to a pixel of FIG. 7A.

FIG. 7A is a cross-sectional view illustrating a display apparatus according to an exemplary embodiment of the invention. FIG. 7B is a cross-sectional view of the display apparatus at a portion corresponding to a pixel of FIG. 7A. The display apparatus is substantially the same as the display apparatus of FIGS. 6A and 6B except that a data pattern and an unevenness insulation pattern 135 for forming an unevenness of a second power supply line are provided as one layer, and thus repeated description will be omitted.

Referring to FIGS. 7A and 7B, in a display area DA, the display apparatus may include a substrate 100, a buffer layer 110, an active pattern ACT, a gate insulation layer 120, a gate pattern, an insulating interlayer 130, a data pattern, a first insulation layer 140, a pixel defining layer PDL, a light emitting structure 180 and a thin film encapsulation layer 190.

In a peripheral area PA, the display apparatus may include the substrate 100, the buffer layer 110, the circuit part active pattern ACTa, the gate insulation layer 120, the gate pattern, the insulating interlayer 130, the data pattern, the first insulation layer 140, the first insulation dam DM1, the second insulation dam DM2, the third insulation dam DM3 and the thin film encapsulation layer 190.

The data pattern may include a circuit part source electrode SEa and a circuit part drain electrode DEa of a circuit part thin film transistor TFTa, and a second power supply line PL2.

Unevenness may be provided on the second power supply line. That is, a plurality of grooves may be defined in upper and lower surfaces of the second power supply line PL2 so that the upper and lower surfaces may form an uneven surface. As a result, area of the second power supply line PL2 increases and the wiring resistance may be reduced.

At this time, the unevenness insulation pattern 135 may be provided between the insulating interlayer 130 and the second power supply line PL2. The unevenness insulation pattern 135 may have unevenness on an upper surface thereof to form an uneven surface. The unevenness insulation pattern 135 may be provided by various methods. In an exemplary embodiment, when the unevenness insulation pattern 135 is provided, a photoresist material may be used, and the uneven insulating pattern 135 may be provided by changing amount of exposure using a slit mask, a halftone mask, or the like so that a specific portion is etched (removed) relatively more than other portions, for example. That is, the second power supply line PL2 contacting the unevenness insulation pattern 135 may have unevenness provided corresponding to the unevenness of the unevenness insulation pattern 135.

Figure 8:
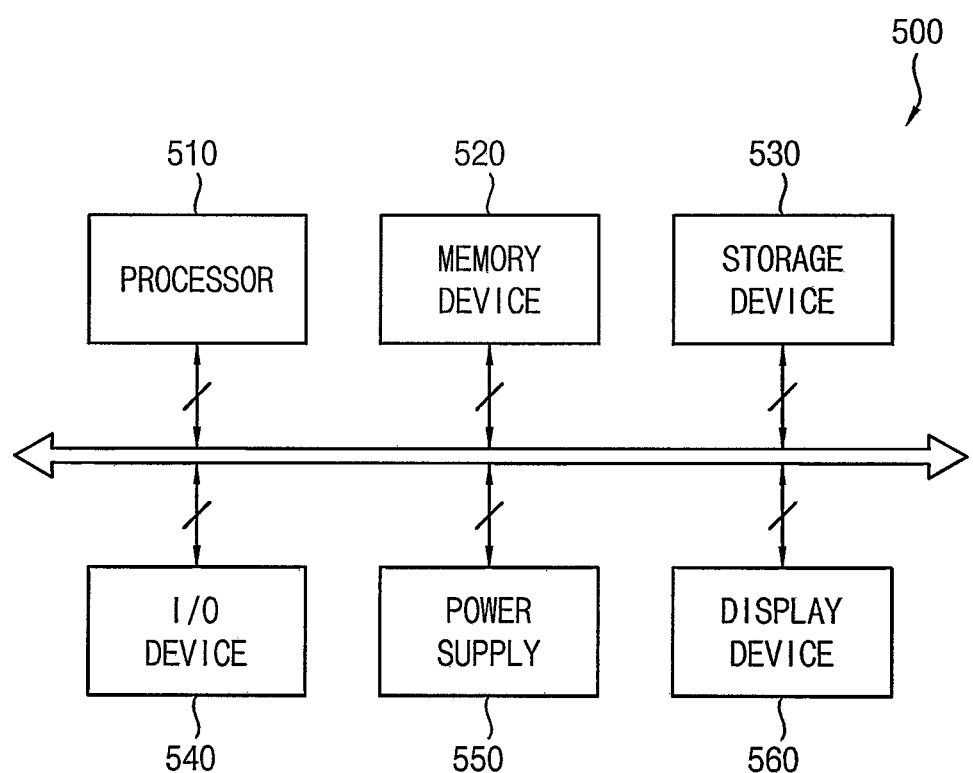
FIG. 8 is a block diagram illustrating exemplary embodiments of an electronic device.
Figure 9A:
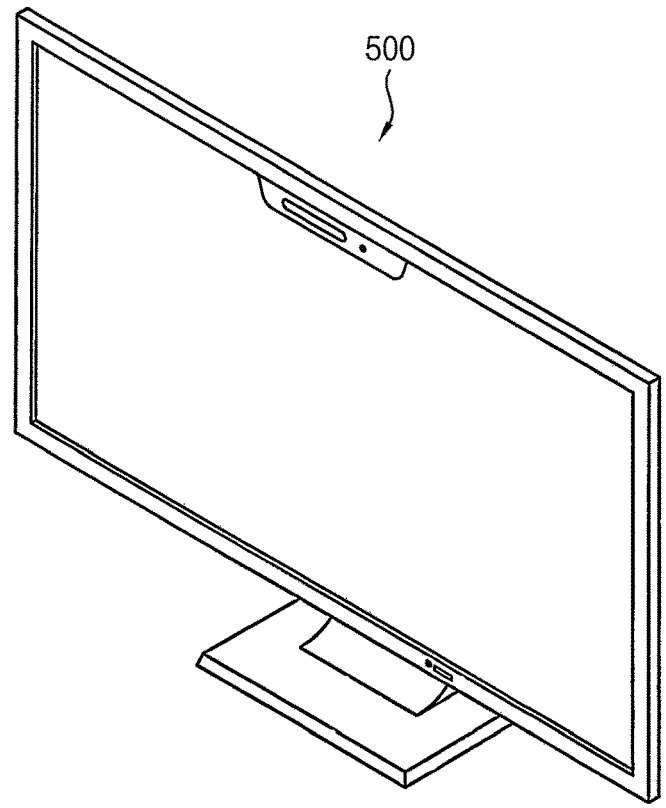
FIG. 9A is a diagram illustrating an example in which the electronic device of FIG. 8 is implemented as a television.
Figure 9B:
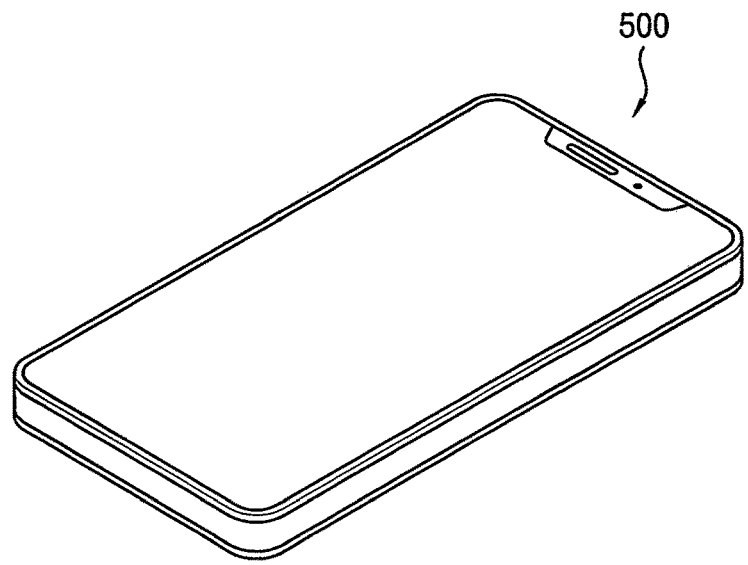
FIG. 9B is a diagram illustrating an example in which the electronic device of FIG. 8 is implemented as a smart phone.

FIG. 8 is a block diagram illustrating an electronic device according to exemplary embodiments. FIG. 9A is a diagram illustrating an example in which the electronic device of FIG. 8 is implemented as a television. FIG. 9B is a diagram illustrating an example in which the electronic device of FIG. 8 is implemented as a smart phone.

Referring to FIGS. 8 to 9B, the electronic device 500 may include a processor 510, a memory device 520, a storage device 530, an input/output ("I/O") device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus ("USB") device, other electronic devices, etc. In an exemplary embodiment, as illustrated in FIG. 12A, the electronic device 500 may be implemented as a television. In another exemplary embodiment, as illustrated in FIG. 12B, the electronic device 500 may be implemented as a smart phone. However, the electronic device 500 is not limited thereto. In an exemplary embodiment, the electronic device 500 may be implemented as a cellular phone, a video phone, a smart pad, a smart watch, a tablet personal computer ("PC"), a car navigation system, a computer monitor, a laptop, a head mounted display ("HMD"), etc., for example.

The processor 510 may perform various computing functions. The processor 510 may be a micro processor, a central processing unit ("CPU"), an application processor ("AP"), etc. The processor 510 may be coupled to other components via an address bus, a control bus, a data bus, etc. Further, the processor 510 may be coupled to an extended bus such as a peripheral component interconnection ("PCI") bus. The memory device 520 may store data for operations of the electronic device 500. In an exemplary embodiment, the memory device 520 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example. In an exemplary embodiment, the storage device 530 may include a solid state drive ("SSD") device, a hard disk drive ("HDD") device, a CD-ROM device, etc., for example. In an exemplary embodiment, the I/O device 540 may include an input device such as a keyboard, a keypad, a mouse device, a touchpad, a touch-screen, etc., and an output device such as a printer, a speaker, etc., for example. The power supply 550 may provide power for operations of the electronic device 500.

The display device 560 may be coupled to other components via the buses or other communication links. In some exemplary embodiments, the display device 560 may be included in the I/O device 540. As described above, according to the display device 560, display quality may be improved even when the brightness of the display device 560 is increased by reducing wiring resistance of the power supply line while reducing a width of the peripheral area which is the non-display area. However, since this has been described above, a duplicate description thereof will be omitted.

The invention may be applied to organic light emitting display devices and various electronic devices including the same. In an exemplary embodiment, the invention may be implemented as a cellular phone, a video phone, a smart pad, a smart watch, a tablet PC, a car navigation system, a computer monitor, a laptop, a HMD, etc., for example.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus, comprising:
    a substrate;
    a first-layer power supply line disposed on the substrate in a peripheral area which does not display an image, the peripheral area surrounds a display area in which an image is displayed;
    a second-layer power supply line disposed only in the peripheral area and disposed on the first-layer power supply line, and contacting the first-layer power supply line; and
    a light emitting structure comprising a first electrode, a light emitting layer disposed on the first electrode, and a second electrode disposed on the light emitting layer and electrically connected to the second-layer power supply line,
    wherein the first-layer power supply line and the second-layer power supply line supply a power voltage to the second electrode which acts as a cathode of the light emitting structure.

2. The display apparatus of claim 1, further comprising:
    a circuit part thin film transistor disposed in a circuit part area which is between the first-layer power supply line and the display area, and
    wherein the second-layer power supply line extends to the circuit part area.

3. The display apparatus of claim 1, wherein a voltage level of −3 volts or less is applied to the second electrode.

4. The display apparatus of claim 1, further comprising:
    a first insulation layer on the substrate on which the first-layer power supply line is disposed; and
    a second insulation layer on the first insulation layer on which the second-layer power supply line is disposed.

5. The display apparatus of claim 4, wherein the first insulation layer and the second insulation layer comprise organic insulation material.

6. The display apparatus of claim 4, further comprising:
    a thin film encapsulation layer which comprises a first inorganic layer disposed on the second-layer power supply line and the second electrode, a second inorganic layer disposed on the first inorganic layer, and an organic layer disposed between the first inorganic layer and the second inorganic layer.

7. The display apparatus of claim 6, further comprising:
    a first insulation dam disposed on the second-layer power supply line; and
    a second insulation dam spaced apart from the first insulation dam, and has a height higher than the first insulation dam.

8. The display apparatus of claim 7, further comprising:
    a pixel defining layer,
    wherein the first insulation dam and the second insulation dam include the same layer as any one or more layers of the first insulation layer, the second insulation layer, and the pixel defining layer.

9. The display apparatus of claim 8, wherein a power supply line comprises the first-layer power supply line and the second-layer power supply line, and
    the power supply line extends along the peripheral area.

10. The display apparatus of claim 1, further comprising:
    a buffer layer disposed on the substrate;
    a circuit part active pattern of a circuit part thin film transistor disposed on the buffer layer in the peripheral area;
    a gate insulation layer disposed on the buffer layer on which the circuit part active pattern is disposed;

a gate pattern disposed on the gate insulation layer, and comprising a gate electrode of the circuit part thin film transistor;

an insulating interlayer disposed on the gate insulation layer on which the gate pattern is disposed; and a first data pattern disposed on the insulating interlayer, and comprising the first-layer power supply line.

11. The display apparatus of claim 10, further comprising:

a third insulation dam disposed on the buffer layer, and contacting the gate insulation layer and the insulating interlayer.

12. The display apparatus of claim 10, wherein the second-layer power supply line is overlapped with the circuit part thin film transistor.

* * * * *